(12) United States Patent
Booth et al.

(10) Patent No.: US 7,042,258 B2
(45) Date of Patent: May 9, 2006

(54) SIGNAL GENERATOR WITH SELECTABLE MODE CONTROL

(75) Inventors: Richard V. Booth, Riegelsville, PA (US); Roger L. Minear, Wyomissing, PA (US); Parag Parikh, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 26 days.

(21) Appl. No.: 10/834,730

(22) Filed: Apr. 29, 2004

(65) Prior Publication Data

US 2005/0242851 A1 Nov. 3, 2005

(51) Int. Cl.
*H03K 21/00* (2006.01)

(52) U.S. Cl. .................. 327/115; 327/117; 327/156

(58) Field of Classification Search ........ 327/113–119, 327/141, 162, 146–148, 163, 154–157; 331/DIG. 2; 375/373–376; 455/260
See application file for complete search history.

(56) References Cited

U.S. PATENT DOCUMENTS

| | | | | |
|---|---|---|---|---|
| 5,424,687 A | | 6/1995 | Fukuda .................. | 331/11 |
| 5,473,533 A | | 12/1995 | Mengelt .................. | 700/32 |
| 5,822,387 A | | 10/1998 | Mar ....................... | 375/376 |
| 5,872,807 A | * | 2/1999 | Booth et al. ............ | 375/130 |
| 6,219,397 B1 | * | 4/2001 | Park ....................... | 375/376 |
| 6,292,507 B1 | * | 9/2001 | Hardin et al. ........... | 375/130 |
| 6,362,670 B1 | * | 3/2002 | Beaulieu ................. | 327/156 |
| 6,377,646 B1 | * | 4/2002 | Sha ....................... | 375/376 |
| 6,515,553 B1 | * | 2/2003 | Filiol et al. ............. | 332/127 |
| 6,549,078 B1 | * | 4/2003 | Sridharan et al. ....... | 331/17 |
| 6,553,057 B1 | * | 4/2003 | Sha et al. ............... | 375/130 |
| 6,559,698 B1 | * | 5/2003 | Miyabe .................. | 327/157 |
| 6,594,330 B1 | * | 7/2003 | Wilson ................... | 375/376 |
| 6,608,530 B1 | * | 8/2003 | Green et al. ............. | 331/25 |
| 6,720,809 B1 | * | 4/2004 | Canard et al. .......... | 327/156 |
| 6,754,289 B1 | * | 6/2004 | Komiyama .............. | 375/327 |
| 6,828,835 B1 | * | 12/2004 | Cho ........................ | 327/158 |
| 6,882,230 B1 | * | 4/2005 | Iadanza et al. .......... | 331/16 |
| 6,919,744 B1 | * | 7/2005 | Paist et al. .............. | 327/115 |

* cited by examiner

*Primary Examiner*—Timothy P. Callahan
*Assistant Examiner*—Hai L. Nguyen

(57) ABSTRACT

A signal generator circuit includes a controller adapted to generate a divide value in accordance with at least a first control signal, and a divider adapted to divide an output signal of the signal generator circuit by the divisor value. The controller is selectively operable in at least one of a plurality of modes in accordance with at least a second control signal. The controller is configured to calculate each of one or more new divide values so as to vary a frequency of the output signal in accordance with at least one of the first and second control signals. The controller is configured to switch between operational modes and/or switch between divide values, the switching between operational modes and/or divide values being performed in such a manner so as to substantially eliminate discontinuities in the frequency of the output signal.

24 Claims, 5 Drawing Sheets

SIGNAL GENERATOR WITH SELECTABLE MODE CONTROL

CROSS-REFERENCE TO RELATED (APPLICATION(S)

This application relates to commonly assigned U.S. application entitled "Spectrum Profile Control for a PLL and the Like" filed on Aug. 20, 2003 and assigned application Ser. No. 10/644,362, the disclosure of which is incorporated by reference herein.

FIELD OF THE INVENTION

The present invention relates generally to electronic circuits, and more particularly relates to signal generators.

BACKGROUND OF THE INVENTION

In certain electronic devices, it is often necessary to distribute a reference clock signal, or divisions thereof, to various digital circuitry in the devices. The reference clock may operate at high frequencies, such as, for example, above about 350 megahertz (MHz). However, such high frequencies may cause the digital circuitry to radiate signals as electromagnetic energy, and these electromagnetic emissions can interfere with the normal operation of surrounding equipment, a condition often referred to as electromagnetic interference (EMI). Since the electromagnetic emissions are based on the reference clock signal, emitted high energy "spikes" will be concentrated at the reference clock frequency and harmonics thereof.

In order to minimize EMI generated by such electronic devices, the electronic devices are often shielded, which adds significant bulk and cost to the devices and is therefore undesirable. Alternatively, the operation of the electronic devices may be modified so as to distribute the emitted energy over a wider frequency range, thereby reducing the energy emitted at any given frequency. One known methodology for modifying the operation of the electronic devices is to vary the clock frequency over a range of frequencies such that an average frequency is equal to the desired clock frequency, a technique known as "spread spectrum." Phase-locked loops (PLLs) are well-suited for spread spectrum applications.

Figure 1:
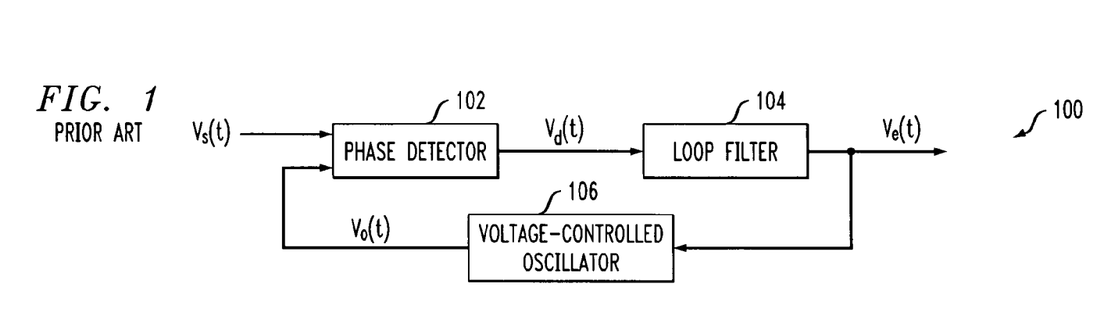
FIG. 1 is a block diagram of a conventional PLL.

The PLL is a frequency-selective feedback system that is capable of synchronizing with a selected input signal and tracking frequency changes associated therewith. FIG. 1 illustrates a basic PLL 100 comprised of three functional blocks, namely, a phase detector 102, a loop filter 104, and a voltage-controlled oscillator (VCO) 106. These three blocks 102, 104, 106 are interconnected in a feedback arrangement as shown. The phase detector 102 compares the phase of a periodic input signal $V_s(t)$ having a frequency $f_s$ with an output frequency of the VCO 106 and generates an error signal $V_d(t)$. This error signal $V_d(t)$ is then filtered by the loop filter 104 and is applied to a control input of the VCO 106 in the form of a filtered error signal $V_e(t)$. The VCO 106 generates an output signal $V_o(t)$ having a frequency which varies in response to the filtered error signal $V_e(t)$.

When the VCO 106 is locked on the input signal, the VCO frequency is essentially identical to the frequency $f_s$ of the input signal $V_s(t)$, except for a finite phase difference $\phi_o$. This net phase difference $\phi_o$ is necessary to generate the corrective error voltage $V_e(t)$ to shift the VCO from a free-running frequency $f_0$ to $f_s$ to thereby maintain lock. The phase detector 102 generally functions as a mixer. The basic theory and principle of operation of PLLs are well known, as described, for example, in Alan B. Grebene, "Bipolar and MOS Analog Integrated Circuit Design," pp. 627–678 (John Wiley & Sons 1984), which is incorporated herein by reference. Consequently, the theory and principle of operation of PLLs in general will not be presented in detail herein.

In a spread spectrum application, the PLL can be switched between a non-slewing mode, wherein the PLL maintains a substantially constant nominal frequency, and a frequency-slewing mode, wherein the PLL output frequency varies from a nominal value to a lower or higher value at which the PLL may be operated for a period of time. However, traditional PLLs are generally not capable of switching between modes in a smooth manner. Consequently, the PLL may undesirably generate glitches and/or may become unlocked during the transition between operating modes.

There exists a need, therefore, for an improved PLL that does not suffer from one or more of the problems exhibited by conventional PLL arrangements.

SUMMARY OF THE INVENTION

The present invention meets the above-noted need by providing, in an illustrative embodiment, techniques for smoothly switching between two or more operational modes in a PLL such that the PLL remains substantially locked during any one of the modes and during a transition between any two modes. Operational modes of the PLL provided by the invention may include, but are not limited to, a frequency-slewing mode, a frequency-spreading mode, a fractional-N frequency synthesis mode, and non-slewing mode.

In accordance with one aspect of the invention, a signal generator circuit includes a controller adapted to generate a divide value in accordance with at least a first control signal, and a divider adapted to divide an output signal of the signal generator circuit by the divisor value. The controller is selectively operable in at least one of a plurality of modes in accordance with at least a second control signal. The controller is configured to calculate each of one or more new divide values so as to vary a frequency of the output signal in accordance with at least one of the first and second control signals. The controller is configured to switch between operational modes and/or switch between divide values, the switching between operational modes and/or divide values being performed in such a manner so as to substantially eliminate discontinuities in the frequency of the output signal.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative single-loop PLL circuit and associated integrated circuit implementations thereof. It should be understood, however, that the present invention is not limited to this or any particular PLL architecture. Rather, the invention is more generally applicable to techniques for advantageously controlling a mode of operation of a PLL, or alternative signal generator (e.g., delay-locked loop (DLL)), in a substantially smooth manner, so as to eliminate or substantially reduce glitches or other discontinuities in a frequency of an output signal of the signal generator, thereby substantially maximizing an amount of time that the signal generator remains in a locked state. The signal generator formed in accordance with the present invention is particularly well-suited for use in a wide variety of integrated circuit applications, as well as in non-integrated circuit applications, and in fact may be implemented as one or more integrated circuits.

Figure 2:
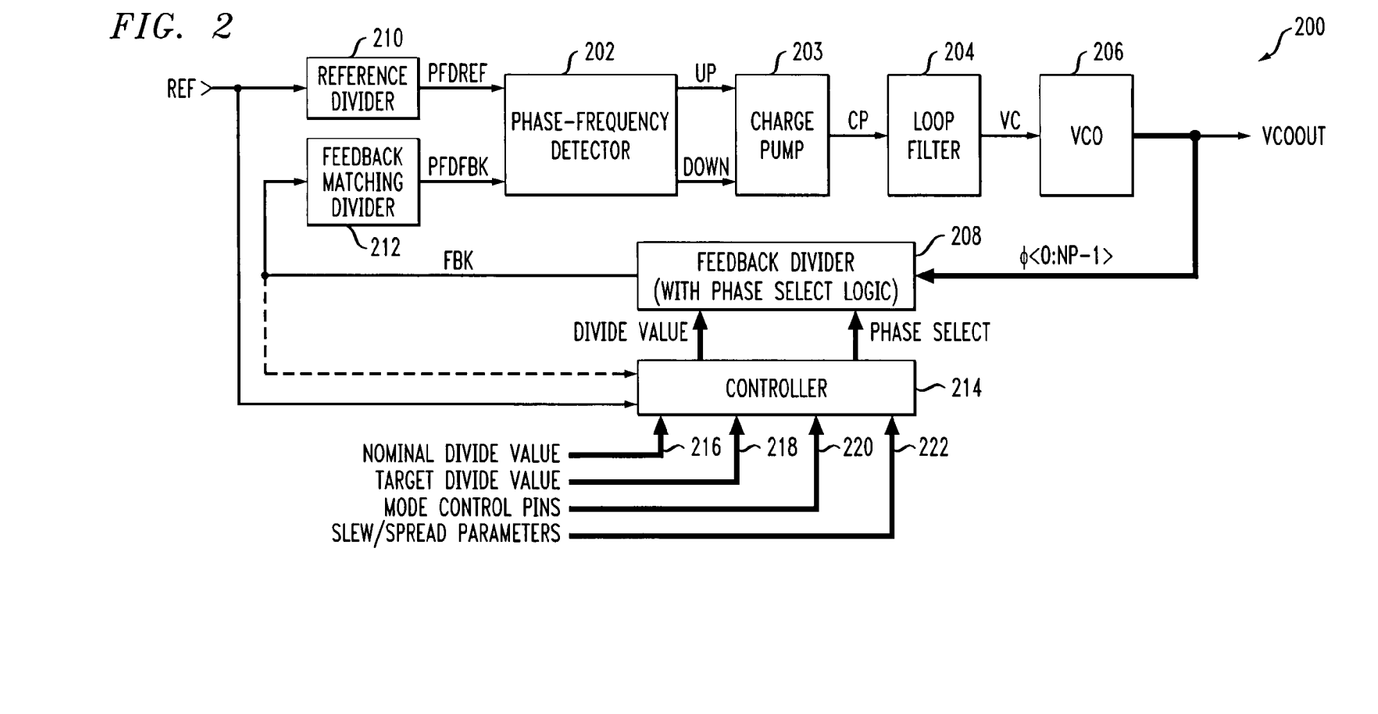
FIG. 2 is a block diagram depicting an exemplary PLL circuit, formed in accordance with one embodiment of the invention.

FIG. 2 is a block diagram illustrating an exemplary PLL 200 in which the techniques of the present invention are implemented. The PLL is preferably operable in a radio frequency (RF) frequency range (e.g., greater than about 350 MHz), although the invention is not limited to any particular frequency range of operation. The exemplary PLL 200 comprises a phase-frequency detector (PFD) 202, a charge pump 203, a loop filter 204 and a VCO 206. The PFD 202 preferably includes a first input for receiving a first signal PFDREF having a frequency $F_{REF}$ and a phase $\phi_{REF}$ associated therewith. The frequency $F_{REF}$ of signal PFDREF may be a division of a frequency of an input reference signal REF presented to the PLL 200. PFD 202 further includes a second input for receiving a second signal PFDFBK having a frequency $f_{FB}$ and a phase $\phi_{FB}$ associated therewith. The frequency $f_{FB}$ of signal PFDFBK may be a sub-multiple of a frequency $f_{VCO}$ of an output signal VCOOUT generated by the VCO 206. PFD 202 is preferably configurable for generating one or more pulse signals, UP and DN, indicative of a difference in phase between the two signals PFDREF and PFDFBK. Based on a comparison between the two input signals, the PFD 202 preferably generates the UP pulse signal when $\phi_{REF}$ leads $\phi_{FB}$, generates the DN pulse signal when $\phi_{REF}$ lags $\phi_{FB}$, and generates no pulses when $\phi_{REF}$ is equal to $\phi_{FB}$.

The charge pump 203 preferably generates a signal CP on the basis of, at least in part, the pulse signals UP and DN, where a sign of the signal CP is indicative of a direction of pulse signal UP or DN. Depending on whether the signal generated by the PFD 202 is an UP signal or a DN signal, a charge is either added to or subtracted from, respectively, a capacitance (not shown) in the loop filter 204. Thus, the loop filter 204 functions as an integrator which accumulates the net charge from the charge pump 203. A voltage VC across the capacitance in the loop filter 204 is used as a control signal for controlling the output frequency of the VCO 206. The value of the capacitance in the loop filter 204 is preferably chosen such that a time constant of the loop filter is substantially larger than a period of the input reference signal REF. The loop filter 204 may have a relatively simple design, comprising, for example, a first capacitor connected in parallel with a series combination of a resistor and a relatively large second capacitor, which may be on the order of hundreds of picofarad. Other loop filter arrangements are similarly contemplated by the invention, as will be known by those skilled in the art.

The exemplary PLL 200 further comprises a feedback divider 208, a reference divider 210 and a feedback matching divider 212. The feedback divider 208 is preferably coupled in a series feedback configuration, so as to form a feedback loop between the output of the VCO 206 and the second input of the PFD 202. The feedback divider 208 is preferably configurable for generating feedback signal FBK, which is a selected division of the VCO output signal VCOOUT. The feedback divider 208, together with respective gains associated with the PFD 202, charge pump 203, loop filter 204, VCO 206 and/or feedback matching divider 212, sets an open-loop gain of the PLL 200. The feedback divider 208 will be described in further detail below, in conjunction with one aspect of the invention.

The reference divider 210, which may be referred to as a prescaler, is preferably coupled in series with the first input of the PFD 202 and is configurable for generating signal PFDREF, which is a sub-multiple of the input reference signal REF. Likewise, feedback matching divider 212 is preferably coupled in series with the second input of the PFD 202 and is configurable for generating signal PFDFBK, which is a sub-multiple of feedback signal FBK generated by the feedback divider 208. One or more of the feedback divider 208, reference divider 210 and matching feedback divider 212 may be implemented in a conventional manner, such as, for example, using a programmable counter, although alternative divider and/or scaling circuitry may also be employed. PLL 200 may also include a post-VCO divider (not shown), which may be referred to as a postscaler, coupled to the VCO 206 for scaling an output of the PLL as desired.

One or more of the PFD 202, charge pump 203, loop filter 204 and VCO 206 may be implemented in a conventional fashion, as will be understood by those skilled in the art. For example, VCO 206 may be implemented as an inductor-capacitor (LC) oscillator having a fixed inductor value and a variable capacitor value, although other suitable VCO implementations may be employed. In a preferred embodiment of the invention, the VCO 206 comprises a ring oscillator including a plurality of delay stages (not shown). An output of each of the delay stages in the VCO 206 may be provided as taps, with each tap representing a different phase $\phi<0:NP-1>$ of the VCO output signal VCOOUT, where NP is the number of delay stages in the VCO. The output signal VCOOUT generated by the VCO 206 may provide, for example, either 1, 2, 4, 8 or 16 phases, although the number of phases output from the VCO is not limited by the invention. One or more of the VCO output phases $\phi<0:NP-1>$ are preferably presented to the feedback divider 208, which divides the output signal of the VCO 206 by a divisor, M, to generate the feedback signal FBK.

As previously stated, the techniques of the present invention beneficially enable the PLL 200 to smoothly switch between two or more operational modes in the PLL, such that the PLL remains substantially locked while operating in any one of the selected modes and during a transition between any two modes. Operational modes of the PLL provided by the invention may include, but are not limited to, a frequency-slewing mode, a frequency-spreading mode, a fractional-N frequency synthesis mode, and a non-slewing mode.

In the frequency-slewing mode, the PLL 200 is preferably operable to smoothly ramp the frequency $f_{VCO}$ of the VCO output signal VCOOUT from a nominal value to a lower or higher off-nominal value, where the PLL may be operated for a time, and to ramp the frequency $f_{VCO}$ back to the nominal value when the off-nominal frequency operation has ended. The PLL 200 is also preferably operable to smoothly slew between a plurality of off-nominal frequencies. The off-nominal frequency values may be significantly different from the nominal value and/or from one another (e.g., greater than about two percent of the nominal frequency value), and are limited only by practical design considerations of the PLL, such as, for example, size of the feedback divider, PLL loop dynamics, frequency limitations of the VCO 206, etc. This mode may be useful, for example, in applications which use one or more frequencies lower than the nominal operating frequency in order to conserve power whenever possible to do so, but while full functionality is required during and after the transition.

In the frequency-spreading mode, the PLL is preferably operable to provide an output signal that continuously changes frequency (e.g., varying up and down in frequency) so that the output energy is not concentrated on one particular frequency. As previously stated, this mode of operation is advantageous, for example, for reducing EMI in an electronic device utilizing high-frequency clock signals.

In the fractional-N frequency synthesis mode, where N represents a divide value, the PLL 200 is preferably operable to provide an output frequency that is not restricted to an integer multiple of the signal frequency appearing at the second input of the PFD 202. Fractional-N frequency synthesis eases the requirements imposed on the PLL (e.g., loop dynamics) for generating frequencies which are not simple ratios of small integers. For example, to generate a frequency of 729 MHz using an input reference clock of 20 MHz, the simplest ratio of integers is 729/20, which may be difficult or impossible to implement with a given PLL. Using a fractional-N approach, an effective fractional division of 36.45 is significantly easier to implement. Fractional-N frequency synthesis methodologies are well-known by those skilled in the art.

The PLL 200 further comprises a controller 214 which is configurable for selectively controlling one or more parameters of the feedback divider 208, and thus for controlling one or more characteristics and/or modes of operation of the PLL 200. Controller 214 preferably generates a first control signal DIVIDE VALUE for selectively controlling the divisor M associated with the feedback divider 208 based, at least in part, on one or more input control signals, such as, for example, nominal divide value 216, target divide value 218, mode control pins 220 and slew/spread parameters 222, presented to the controller 214. It is to be understood that the invention is not limited to the precise number and/or type of control inputs shown in the figure. The divisor M may be any positive real number (e.g., M need not be a rational number). The frequency $f_{VCO}$ of the output signal provided by the VCO 206 is related to the frequency $F_{REF}$ of the signal PFDREF by the relation $F_{VCO}=F_{REF}\times M$.

In accordance with embodiments of the invention, controller 214 receives the input reference signal REF to allow for proper timing between generation of the divisor M and the fractional division of the VCO output signal VCOOUT. The input reference signal REF may also be used by the controller 214 to ensure proper timing between changes in the mode of operation of the PLL 200, as may be selected, for example, by the mode control pins 220. It is to be appreciated that the controller 214 may alternatively receive feedback signal FBK, or a multiple of the input reference or feedback signals, to ensure proper timing in the PLL.

When more than one phase of the VCO output signal VCOOUT is presented to the feedback divider 208, the feedback divider preferably comprises phase selection circuitry (not shown), which may include, for example, a phase multiplexer or alternative selection logic, as will be understood by those skilled in the art. The controller 214 preferably generates a second control signal PHASE SELECT provided to the feedback divider 208 for selecting a desired phase of the VCO output signal to be output by the feedback divider based, at least in part, one or more of the input control signals 216, 218, 220 and 222.

Figure 3:
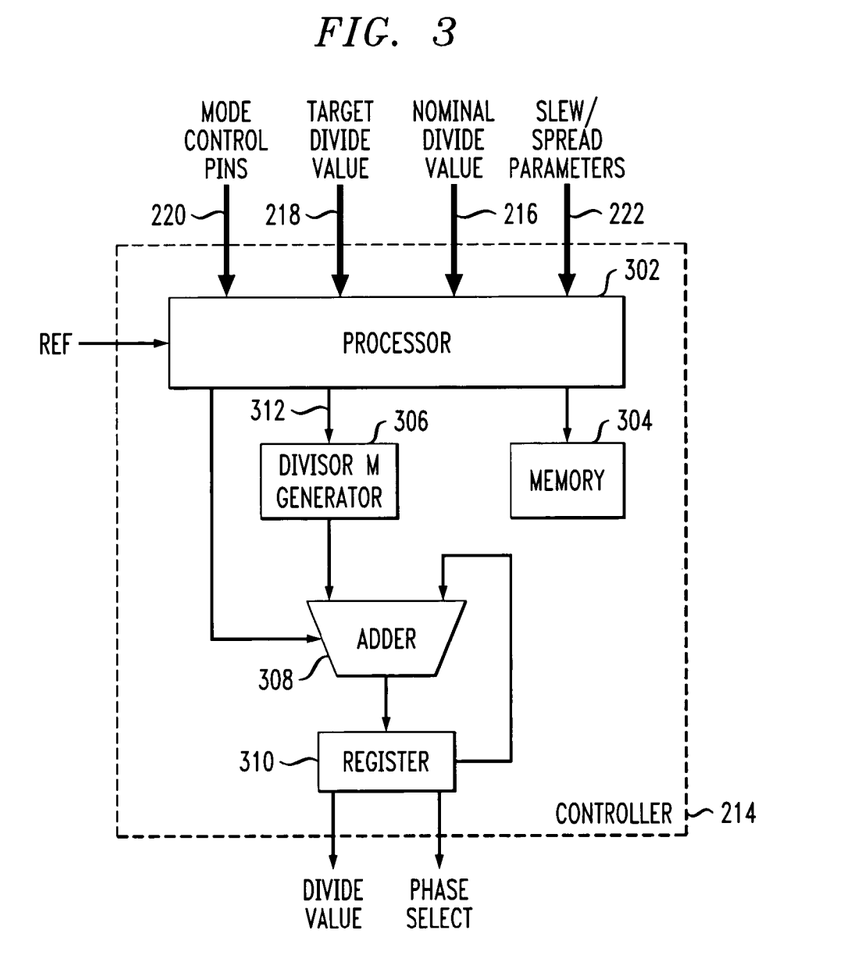
FIG. 3 is a block diagram depicting an exemplary controller circuit suitable for use in the PLL circuit shown in FIG. 2, formed in accordance with the present invention.

FIG. 3 depicts an illustrative controller 214 suitable for use with the present invention. Controller 214 preferably comprises a processor 302, and may further include memory 304 coupled to the processor for at least temporarily storing one or more values utilized by the processor (e.g., frequency slewing and/or spreading parameters, divisor values, etc.). It is to be appreciated that the term "processor" as used herein is intended to include any processing device, state machine, etc., such as, for example, one that includes a central processing unit (CPU) and/or other processing circuitry. Moreover, the term "processor" may refer to more than one processing device, and various elements associated with a processing device may be shared by other processing devices. The term "memory" as used herein is intended to include memory associated with a processor or CPU, such as, for example, registers, random access memory (RAM), read-only memory (ROM), etc. The processor may further include an input/output (IO) interface for entering data to the processor and/or presenting results associated with the processor.

The controller 214 may include a divisor M generator 306. The divisor M generator 306 preferably receives at least one control signal 312, which may include one or more frequency spreading parameters, the nominal divide value for M, and the input reference signal REF for timing generation of values for the divisor M that are synchronized to the input reference signal. Such signals may be provided to the divisor M generator 306 by the processor 302. Synchronizing the generation of divisor M values to the input reference signal REF, or alternatively to the feedback signal FBK, allows for updating a phase accumulation of a fractional accumulation technique, as described in related application Ser. No. 10/644,362. Other fractional accumulation methodologies will be known by those skilled in the art. Divisor M generator 306 preferably generates a desired value MD for the divisor M according to the spreading parameters 222 presented to the controller 214.

A difference between a current value and the desired value MD for divisor M is preferably applied to a combiner, which may be implemented in accordance with an adder 308. The desired value $M_D$ is represented as an integer and a fraction with a given precision. Since the desired value $M_D$ might not be an integer, the feedback divider 208 shown in FIG. 2 preferably comprises a fractional divider (not shown). Fractional dividers are well-known in the art. The adder 308, in conjunction with a storage register 310, may be configured as an accumulator, as shown, for implementing the fractional accumulation technique. It is to be appreciated that the controller 214 may comprise alternative circuitry and/or may be configurable for implementing alternative techniques for generating an output frequency that is not restricted to an integer multiple of the frequency of the input reference signal REF, as will be understood by those skilled in the art.

With reference again to FIG. 2, as previously stated, the PLL 200 is preferably selectively operable in at least one of a plurality of modes, including, for example, a frequency-slewing mode, a frequency-spreading mode, and a fractional-N frequency synthesis mode. The controller 214 is preferably configured so as to substantially eliminate discontinuities (e.g., glitches) in the frequency of the output signal of the VCO 206 during a transition between operational modes. In this manner, the PLL 200 can substantially maximize an amount of time the PLL remains locked. The controller may comprise a state machine, or other sequential logic, for smoothly switching between operational modes. The controller may receive the input reference signal, VCO output signal, or a multiple of the input reference signal or VCO output signal, as a means of synchronizing the switching of the PLL modes, such as, for example, with a transition of the input reference signal from a logical low level to a logical high level, or vice versa (e.g., positive or negative edge). Likewise, the controller may use the input reference signal to synchronize the generation of new divisor values for varying the frequency of the VCO output signal as desired in a substantially glitch-free manner.

During the frequency-spreading mode of operation, the controller is preferably configured to vary the frequency of the output signal VCOOUT around a nominal frequency in response to one or more spreading parameters 222, which may comprise a spreading profile. The frequency of the output signal may be varied over a narrow designated range, such as, for example, less than about 0.5 percent of the nominal frequency, so that an average frequency of the output signal is substantially equal to a designated frequency value. A target divide value, which may also be referred to as a spread depth, is preferably established by a maximum spread parameter SPRD_MAX and a spreading rate parameter SPRD_RATE.

Unlike frequency-slewing, in frequency-spreading, divisor value M of the feedback divider does not change from a nominal to an off-nominal value, but rather the divisor value remains at the nominal value and is essentially dithered. For down-spreading, the divisor value M preferably changes between consecutive two values, e.g., from MNOM to MNOM−1, where MNOM is a nominal divider value. Likewise, for up-spreading, M may be varied between MNOM and MNOM+1. The present invention, however, is not limited to changing the divisor value between two consecutive values. The dithering, together with appropriate VCO phase selection, yields an average value for M which is non-integer. The resulting feedback value may thus be regarded as being an integer plus a fraction.

By way of example only, to obtain a non-integer divide value of about 199.7, over a period of ten cycles, the controller may be configured to vary M as follows: 200, 199, 200, 200, 199, 200, 200, 200, 199, 200. Using additional phases of the VCO provides a more accurate step through the divider values, thereby increasing a resolution of the feedback divider, although the use of dithering is still desirable in order to obtain any reasonable off-nominal frequency. An important aspect of the PLL is that it substantially filters a discreteness in the divisor value changes. Thus, while a spreading profile associated with the controller 214 for varying the divisor value M of the feedback divider 208 may appear as a series of steps, the output signal VCOOUT generated by the PLL 200 shown in FIG. 2 will be substantially smooth.

Figure 4:
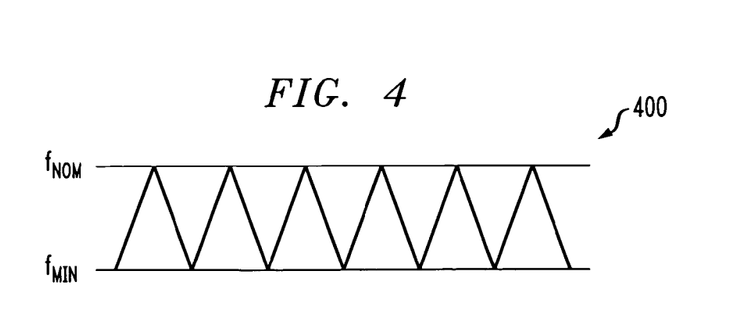
FIG. 4 is a graph illustrating an exemplary triangular spectrum control profile for the PLL circuit shown in FIG. 2.
Figure 5:
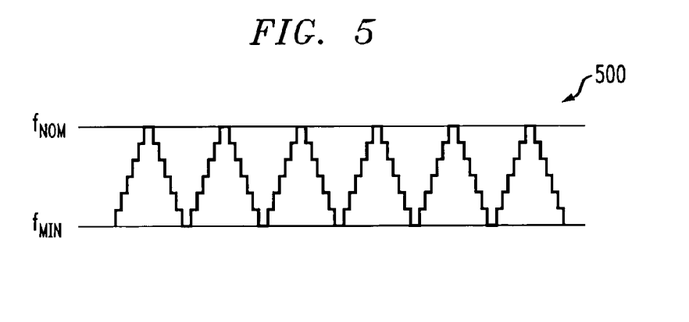
FIG. 5 is a graph illustrating an exemplary quantized triangular spectrum control profile for the PLL circuit shown in FIG. 2.

FIG. 4 depicts an exemplary triangular spreading profile 400 generated by the controller 214 for the PLL 200 of FIG. 2. In the exemplary triangular spreading profile 400, the frequency of the output signal VCOOUT varies from a nominal frequency $f_{NOM}$ down to a minimum frequency $f_{MIN}$. Since the divisor value M generated by the controller 214 is changed at discrete intervals, the spreading profile will, in practice, appear as a quantized triangular spreading profile 500, as shown in FIG. 5. To generate the quantized triangular spreading profile 500 shown in FIG. 5, the controller is preferably configured to step down the value of the divisor M from a nominal divisor value ($M_{NOM}$) by a desired amount, which may defined as a slope value, until a minimum divisor value ($M_{MIN}$) is reached. Once the minimum divisor value $M_{MIN}$ is reached, the controller preferably steps up the divisor value M by the slope value until the nominal divisor value $M_{NOM}$ is reached. This methodology is then repeated until the frequency-spreading mode has ended. The nominal divisor value, minimum divisor value and slope value, among other characteristics of the frequency-spreading mode, are preferably included in the slew/spreading parameters 222 presented to the controller 214 (see FIG. 2).

Although the exemplary spreading profiles depicted in FIGS. 4 and 5 illustrate down-spreading, wherein a maximum divisor value $M_{MAX}$ is equal to the nominal divisor value $M_{NOM}$, it is to be understood that the controller may be configured to provide various other frequency-spreading profiles, including, but not limited to, up-spreading and center-spreading, in a similar manner. For example, up-spreading may be accomplished by setting the maximum divisor value $M_{MAX}$ to be greater than the nominal divisor value $M_{NOM}$, and setting the minimum divisor value $M_{MIN}$ equal to be the nominal divisor value, so that the output frequency of the VCO varies between the nominal frequency and a desired higher frequency. Likewise, center-spreading may be accomplished by setting the maximum divisor value $M_{MAX}$ to be greater than the nominal divisor value $M_{NOM}$, and setting the minimum divisor value $M_{MIN}$ to be less than the nominal divisor value, so that the output frequency of the VCO varies above and below the nominal frequency by a desired amount.

Figure 6:
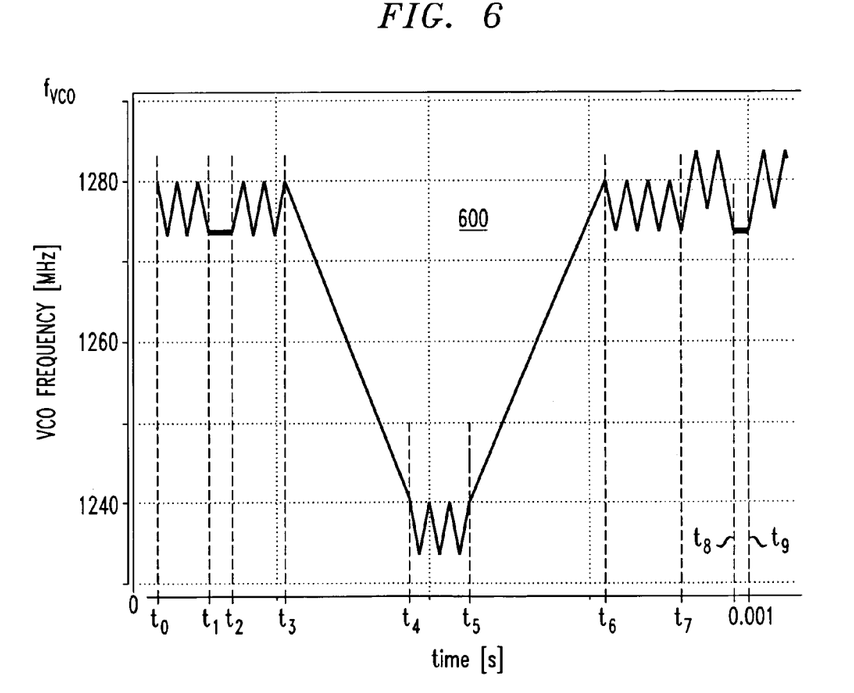
FIG. 6 is an exemplary graph illustrating output frequency as a function of time while the PLL circuit shown in FIG. 2 is operated in different modes, in accordance with an illustrative embodiment of the invention.

By way of example only, FIG. 6 is a graph 600 depicting output frequency $f_{VCO}$, generated by the VCO 206 in the exemplary PLL of FIG. 2, as a function of time, in accordance with an illustrative embodiment of the invention. For this example, it is assumed that the nominal frequency $f_{NOM}$ is about 1280 MHz. As apparent from FIG. 6, the PLL is switched through various operational modes, substantially without any discontinuities in the output frequency.

Beginning at time $t_0$ (e.g., about 0.05 milliseconds (ms)), the PLL enters a spread-down mode, wherein the VCO output frequency $f_{VCO}$ varies, in accordance with a triangular spreading profile, between the nominal frequency and a designated minimum frequency (e.g., about 1274 MHz). The characteristics (e.g., maximum frequency, minimum frequency and slope) are preferably selected, at least in part, by the slew/spread parameters 222 presented to the controller 214 in the PLL 200 (see FIG. 2). After about 2.5 cycles, the PLL is switched to a fractional-N mode of operational at time $t_1$ (e.g., about 0.14 milliseconds (ms)), such as by asserting the appropriate signal(s) on the mode control pins 220 of the controller 214 (FIG. 2). During the fractional-N mode, a target frequency, which may be selected by way of the target divide value control input 218 of the controller 214 (FIG. 2), is preferably set to the divide value yielding the minimum frequency of the programmed spread-down mode (e.g., about 1274 MHz). This target frequency is maintained until time $t_2$ (e.g., about 0.18 ms), at which point the PLL re-enters the spread-down mode.

At time t3 (e.g., about 0.27 ms), the PLL enters a frequency-slewing mode, in this case, a slew-down mode, which may be initiated by asserting the appropriate signal(s) on the mode control pins 220 of controller 214 (FIG. 2). While in the slew-down mode, the PLL is preferably configured to smoothly ramp the output frequency $f_{VCO}$ from the nominal frequency to a desired lower frequency (e.g., about 1240 MHz). Typically, the desired lower frequency will be substantially different than the nominal frequency (e.g., a ratio greater than about one to three). In a standard PLL, changing the divide value abruptly can cause the PLL to enter an acquire mode, wherein phases are often missed (e.g., phase slipping) and the frequency of the output signal may go somewhat higher than the nominal frequency (e.g., frequency peaking). These two effects resulting from an abrupt change in divider value are undesirable, particularly for a circuit which requires accurate timing throughout the frequency slewing process. Phase slipping can result in entire cycles being missed, and frequency peaking can violate timing in circuits that require a certain setup and/or hold time.

The target divide value signal 218 is preferably used by the controller 214 to establish an off-nominal divide value (FIG. 2). The slew rate, among other characteristics of the frequency-slewing mode (e.g., target frequency), is preferably programmed in accordance with the slew/spread parameters 222 presented to the controller 214 (FIG. 2). To ensure that the PLL remains locked during frequency-slewing, and to alleviate demands placed on down-stream circuits which are required to track the PLL output frequency, the slew rate is preferably chosen to be about half of the frequency-spreading rate, although the invention is not limited to this or any particular slew rate.

Once the target slew-down frequency is reached at time $t_4$ (e.g., about 0.47 ms), the PLL enters the spread-down mode using the target slew-down frequency as a new nominal spread-down frequency. The controller is preferably configured to calculate a new minimum frequency for down-spreading based on the new nominal frequency, keeping the percentage of frequency variation substantially the same as for the previous nominal frequency. For example, if the previous nominal frequency was about 1280 MHz, and the minimum spread-down frequency was about 1274 MHz, this results in a frequency variation of about 0.47 percent. For the new nominal frequency of about 1240 MHz, the new minimum spread-down frequency will be about 1234 MHz with substantially the same percentage of frequency-spreading variation. The PLL remains in the spread-down mode for about three cycles until time $t_5$ (e.g., about 0.57 ms), at which point the PLL re-enters frequency-slewing mode, in this case, a slew-up mode, wherein the output frequency $f_{VCO}$ smoothly ramps up to a new target frequency, which in this example is the previous nominal frequency (e.g., about 1280 MHz).

Once the new target frequency is reached at time $t_6$ (e.g., about 0.78 ms), the PLL enters the spread-down mode again with a nominal frequency of about 1280 MHz. The spread-down mode is maintained for about 3.5 cycles until time $t_7$ (e.g., about 0.89 ms), at which point the PLL enters a center-spread mode, such as by asserting the appropriate signal(s) on the mode control pins 220 of the controller 214 (FIG. 2). As previously explained, while in the center-spread mode, the controller is configured to vary the output frequency $f_{VCO}$ between a maximum frequency that is greater than the nominal frequency and a minimum frequency that is less than the nominal frequency. In the example of FIG. 6, the maximum frequency is about 1284 MHz and the minimum frequency is about 1276 MHz. The PLL remains in the center-spread mode for about 1.5 cycles until time $t_8$, at which point the PLL switches to the fractional-N mode having a target frequency of about 1274 MHz. The PLL remains in the fractional-N mode of operation until time $t_9$ (e.g., about 1.0 ms), at which point the PLL re-enters the center-spread mode.

As apparent from the figure, the controller is configured to vary the output frequency $f_{VCO}$, in accordance with certain parameters supplied to the controller, such that all mode transitions are substantially smooth, and the PLL tracks substantially without generating any discernable glitches or becoming unlocked.

The techniques of the present invention provide for the ability to smoothly slew to any one of a number of target frequencies. To accomplish this, target divide settings are changed after one target value is reached. If a new target value is higher than the present target value, the controller is preferably configured to slew up to the new target value. Likewise, if the new target value is lower than the present target value, the controller preferably slews down to the new target value. At a given target frequency, the controller is preferably configured to adjust-the spread parameter settings, which apply to the nominal frequency, such that the same percentage spread is achieved, as previously described.

Figure 7A:
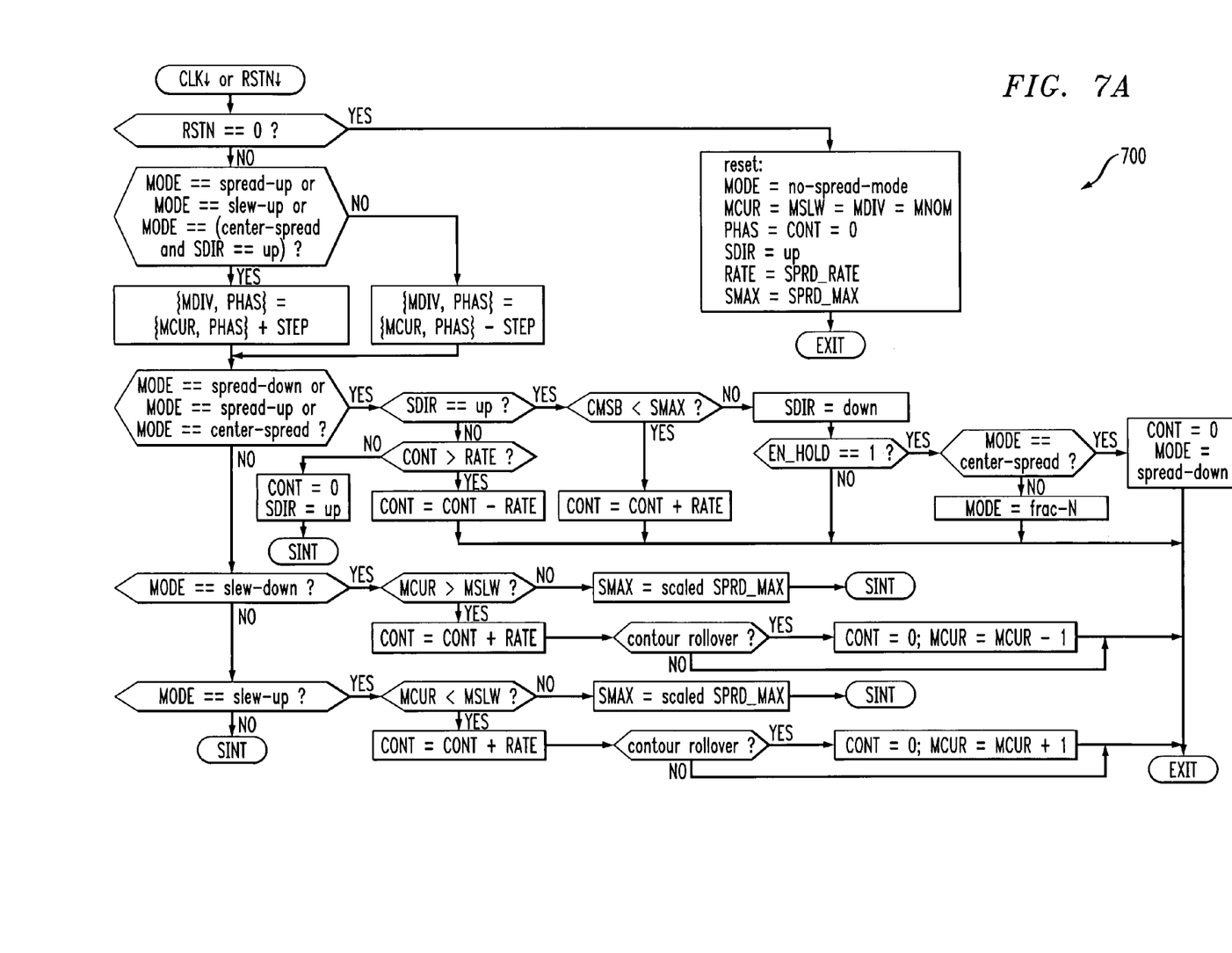
FIGS. 7A and 7B are logical flow diagrams depicting an exemplary methodology for implementing the techniques of the present invention, in accordance with an illustrative embodiment thereof.
Figure 7B:
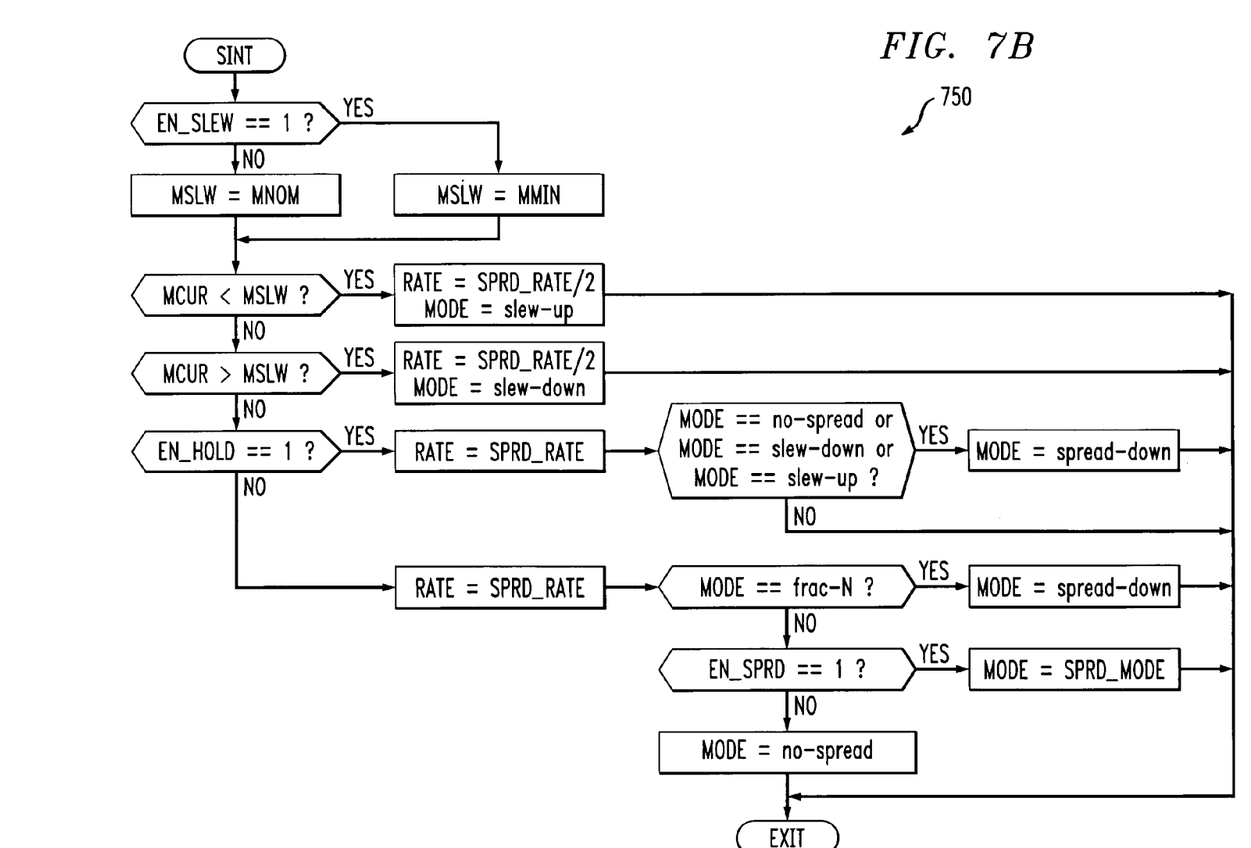

FIGS. 7A and 7B are logical flow diagrams 700 and 750, respectively, depicting an exemplary methodology for implementing the techniques of the present invention, in accordance with an illustrative embodiment thereof. In the figure, the following variables are employed to define certain parameters of the PLL.

The variable CLK represents an input reference clock signal, which may be used to sequence a state of the controller 214 (FIG. 2), and RST represents a reset signal, which may be used to initialize one or more of the variables.

The variable MODE is used as a PLL state register which holds one of a plurality of mode variables representing the mode of operation of the PLL, which, in the exemplary methodology, includes one of spread-up, slew-up, center-spread, spread-down, slew-down, frac-N, and no-spread. For setting the divisor value in the feedback divider 208 (FIG. 2), variable MDIV is a feedback divisor holding register, MCUR is a nominal feedback divisor value, MSLW is a slew feedback divisor value, MMIN is a minimum feedback divisor value, and MNOM is a nominal feedback divisor value. Variable SDIR is a spreading direction register, and variables up and down are used to represent respective spreading directions. Variables EN_HOLD, EN_SLEW and EN_SPRD are used to enable the fractional-N, frequency-slewing and frequency-spreading modes, respectively (e.g., when set to a logic "1").

The variable RATE is a spread-rate holding register, and variable SPRD_RATE is a spread-rate value. The variable SMAX is a spread-depth holding register, and variable SPRD_MAX is a spread-depth value which sets a maximum percentage change in frequency from the nominal frequency. Together, the spread-rate and spread-depth are used, at least in part, to define a desired frequency-spreading profile. Variable PHAS is an accumulated phase register, variable CONT represents a full modulation contour, variable CMSB represents a designated portion of the full modulation contour (e.g., CONT[17:10]), and variable STEP represents a contour step.

It is to be appreciated that the logical flow diagrams shown in FIGS. 7A and 7B are provided by way of example only, and that other suitable alternative methodologies for implementing the techniques of the invention are contemplated, as will be understood by those skilled in the art.

The following illustrative Verilog hardware description language (HDL) might be employed to implement the exemplary methodology shown in FIGS. 7A and 7B, in accordance with one aspect of the invention.

```
module SS_ALGOR (
    CLK, RSTN, EN_SPRD, EN_HOLD, EN_SLEW,
    MNOM, MMIN, SPRD_MODE, SPRD_MAX, SPRD_RATE,
    MOUT, POUT, COUT
);
    parameter SNS=3'b000, SSD=3'b001, SSU=3'b010, SSC=3'b011,
            SFR=3'b100, SLD=3'b101, SLU=3'b110;
    input CLK;              // reference clock
    input RSTN;             // reset
    input EN_SPRD;          // enable frequency spreading
    input EN_HOLD;          // enable frequency holding
    input EN_SLEW;          // enable frequency slewing
    input [6:0] MNOM;           // nominal feed-back divider value
    input [6:0] MMIN;           // final slew divider value
    input [1:0] SPRD_MODE;  // spread-mode
    input [7:0] SPRD_MAX;   // spread-depth (fdev)*mnom*2^8
    input [15:0] SPRD_RATE; // spread-rate (fmod/fclk)*2^11*SPRD*MAX
    output [6:0] MOUT;          // feed-back divider output
    output [3:0] POUT;          // phase select output
    output [7:0] COUT;      // contour output (for monitoring purposes)
    reg [18:0] CONT;        // the full modulation contour
    reg [6:0] MDIV;         // feed-back divider holding register
    reg [6:0] MCUR;         // nominal feed-back divider value/slew current value
    reg [6:0] MSLW;         // slew feed-back divider value
    reg [7:0] PHAS;         // accumulated phase
    reg [15:0] RATE;        // spread-rate holding register
    reg [7:0] SMAX;         // spread-depth holding register
    wire [7:0] CMSB;        // CONT[17:10];
    wire [7:0] STEP;        // contour step (M*-M)*NPHASE
    reg SDIR;               // direction
    reg SINT;               // interrupt
    reg [2:0] MODE;         // algorithm state
    wire [2:0] SMOD;        // mapped spread-spectrum mode
    assign CMSB = CONT[17:10];
    assign MOUT = MDIV;
    assign POUT = PHAS[7:4];
    assign COUT = CMSB;
    assign STEP = ((MODE==SSC) && (2*CMSB>SMAX))?SMAX-CMSB:CMSB;
    assign SMOD = (SPRD_MODE==2'b01)?SSD:
                (SPRD_MODE==2'b10)?SSU:
                (SPRD_MODE==2'b11)?SSC:SNS;
    always @(negedge CLK or negedge RSTN) begin
    if(!RSTN) begin
        SINT <= 0;
        MODE <= SNS;
        MCUR <= MNOM;
        MSLW <= MNOM;
        MDIV <= MNOM;
        PHAS <= 0;
        CONT = 0;
        SDIR <= 1;
        RATE <= SPRD_RATE;
        SMAX <= SPRD_MAX;
    end else begin
        if(((MODE==SSC) && SDIR) || MODE==SSU || MODE==SLU) begin
            {MDIV,PHAS} <= {MCUR,PHAS} + STEP;
        end else begin
            {MDIV,PHAS} <= {MCUR,PHAS} - STEP;
        end
        case(MODE)
            SNS, SFR: SINT <= 1;
            SSD, SSU, SSC:
                if(SDIR) begin
                    if(CMSB < SMAX) begin
                        CONT = CONT + RATE;
                    end else begin
                        SDIR <= 0;
                        if(EN_HOLD) begin
                            if(MODE == SSC) begin
                                CONT = 0;
```

```
                              MODE <= SSD;
                          end else begin
                              MODE <= SFR;
                          end
                      end
                  end
              end else begin
                  if(CONT > RATE) begin
                      CONT = CONT - RATE;
                  end else begin
                      CONT = 0;
                      SDIR <= 1;
                      SINT <= 1;
                  end
              end
          SLD:
              if(MCUR>MSLW) begin
                  CONT = CONT + RATE;
                  if(CONT[18]) begin
                      CONT = 0;
                      MCUR <= MCUR - 1;
                  end
              end else begin
                  SMAX <= SPRD_MAX*(MSLW+4)/(MNOM+4);
                  SINT <= 1;
              end
          SLU:
              if(MCUR<MSLW) begin
                  CONT = CONT + RATE;
                  if(CONT[18]) begin
                      CONT = 0;
                      MCUR <= MCUR + 1;
                  end
              end else begin
                  SMAX <= SPRD_MAX*(MSLW+4)/(MNOM+4);
                  SINT <= 1;
              end
          endcase
          if(SINT) begin
              SINT <= 0;
              MSLW <= EN_SLEW?MMIN:MNOM;
              if (MCUR<MSLW) begin
                  RATE <= SPRD_RATE/2;
                  MODE <= SLU;
              end else if(MCUR>MSLW) begin
                  RATE <= SPRD_RATE/2;
                  MODE <= SLD;
              end else if(EN_HOLD) begin
                  RATE <= SPRD_RATE;
                  case (MODE)
                      SNS, SLD, SLU: MODE <= SSD;
                  endcase
              end else begin
                  RATE <= SPRD_RATE;
                  case(MODE)
                      SFR: MODE <= SSD;
                      default: MODE <= EN_SPRD?SMOD:SNS;
                  endcase
              end
          end
      end
   end
endmodule
```

It is to be understood that the above Verilog HDL is provided by way of example only, and that other suitable alternative implementations are contemplated by the present invention.

The present invention, as described herein, can be embodied in the form of methods and/or apparatuses for performing those methods. At least a portion of the present invention can also be embodied in the form of an article of manufacture comprising a machine readable medium, such as, but not limited to, RAM, ROM, etc., containing one or more programs which, when loaded into and executed by the machine, implement the methodology of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A signal generator circuit, comprising:
a controller adapted to generate a divide value in accordance with at least a first control signal, the controller being selectively operable in at least one of a plurality of modes in accordance with at least a second control signal; and a divider adapted to divide an output signal of the signal generator circuit by the divide value;

wherein the controller is configured to calculate each of one or more new divide values using phase accumulation so as to vary a frequency of the output signal in accordance with at least one of the first and second control signals, and wherein the controller is configured to at least one of switch between operational modes and switch between divide values, the switching between operational modes and the switching between divide values being performed in such a manner so as to substantially eliminate discontinuities in the frequency of the output signal.

2. The circuit as recited in claim 1, wherein the controller is adapted to receive at least a portion of an input reference signal, the controller being configured to synchronize with the received input reference signal with at least one of the switching between operational modes and the switching between divide values.

3. The circuit as recited in claim 1, wherein the controller is adapted to receive at least a portion of the output signal, the controller being configured to synchronize the received output signal with at least one of the switching between operational modes and the switching between divide values.

4. The circuit as recited in claim 1, wherein the controller is adapted to receive at least a portion of an input reference signal, the controller being configured such that the switching between operational modes and the switching between divide values is performed during transitions of the received input reference signal between a first value and a second value.

5. The circuit as recited in claim 1, wherein the controller is adapted to receive at least a portion of the output signal, the controller being configured such that the switching between operational modes and the switching between divide values is performed during transitions of the received output signal between a first value and a second value.

6. The circuit as recited in claim 1, wherein the operational modes of the controller comprise at least one of a frequency-slewing mode, a frequency-spreading mode and a non-slewing mode.

7. The circuit as recited in claim 1, wherein the divider comprises a fractional divider, and wherein the operational modes of the controller include a fractional-N mode, where N denotes the divide value.

8. The circuit as recited in claim 1, wherein an effective divide value generated by the controller comprises a integer portion and a fractional portion.

9. The circuit as recited in claim 1, wherein the circuit comprises one of a phase-locked loop (PLL) and a delay-locked loop (DLL).

10. The circuit as recited in claim 1, wherein the controller is operable in a frequency-slewing mode, and wherein in the frequency-slewing mode the controller is configured to substantially linearly vary the frequency of the output signal between a first frequency value and a second frequency value so as to substantially eliminate discontinuities in the frequency of the output signal.

11. The circuit as recited in claim 10, wherein a difference between the first and second frequency values is greater than about two percent of the first frequency value.

12. The circuit as recited in claim 1, wherein the controller is operable in a frequency-spreading mode, and wherein in the frequency-spreading mode the controller is configured to vary the frequency of the output signal around a nominal frequency in response to one or more spreading parameters supplied to the controller, so that an average frequency of the output signal is substantially equal to a designated frequency value.

13. The circuit as recited in claim 12, wherein the divide value generated by the controller is dithered.

14. The circuit as recited in claim 12, wherein in the frequency-spreading mode, the controller is operable to perform one of down-spreading, center-spreading, and up-spreading in accordance with the one or more spreading parameters.

15. The circuit as recited in claim 12, wherein in the frequency-spreading mode, the controller is operable to vary the frequency of the output signal between a first frequency value and a second frequency value, a difference between the first and second frequency values being less than about two percent of the first frequency value.

16. The circuit as recited in claim 1, wherein the at least first control signal comprises at least one of a slewing profile and a spreading profile, the controller operating in conjunction with the divider to vary the frequency of the output signal in accordance with at least one of the slewing profile and the spreading profile.

17. The circuit as recited in claim 16, wherein the spreading profile comprises a triangular profile.

18. The circuit as recited in claim 16, wherein the controller comprises a state machine.

19. An integrated circuit, comprising:

at least one signal generator, the at least one signal generator comprising:

a controller adapted to generate a divide value in accordance with at least a first control signal, the controller being selectively operable in at least one of a plurality of modes in accordance with at least a second control signal; and a divider adapted to divide an output signal of the signal generator circuit by the divide value;

wherein the controller is configured to calculate each of one or more new divide values using phase accumulation so as to vary a frequency of the output signal in accordance with at least one of the first and second control signals, and wherein the controller is configured to at least one of switch between operational modes and switch between divide values, the switching between operational modes and the switching between divide values being performed in such a manner so as to substantially eliminate discontinuities in the frequency of the output signal.

20. The integrated circuit of claim 19, wherein the controller in the at least one signal generator is adapted to receive at least a portion of an input reference signal, the controller being configured to synchronize the received input reference signal with at least one of the switching between operational modes and the switching between divide values.

21. The integrated circuit as recited in claim 19, wherein the operational modes of the controller in the at least one signal generator comprise at least one of a frequency-slewing mode, a frequency-spreading mode and a non-slewing mode.

22. The integrated circuit as recited in claim 19, wherein the divider in the at least one signal generator comprises a fractional divider, and wherein the operational modes of the controller include a fractional-N mode, where N denotes the divide value.

23. The integrated circuit as recited in claim 19, wherein the at least one signal generator comprises at least one of a phase-locked loop (PLL) and a delay-locked loop (DLL).

24. The integrated circuit as recited in claim 19, wherein the controller in the at least one signal generator is operable in a frequency-slewing mode, and wherein in the frequency-slewing mode the controller is configured to substantially linearly vary the frequency of the output signal between a first frequency value and a second frequency value so as to substantially eliminate discontinuities in the frequency of the output signal.

* * * * *